United States Patent [19]

Lorimer

[11] Patent Number: 5,363,872
[45] Date of Patent: Nov. 15, 1994

[54] LOW PARTICULATE SLIT VALVE SYSTEM AND METHOD FOR CONTROLLING SAME

[75] Inventor: D'Arcy H. Lorimer, Pismo Beach, Calif.

[73] Assignee: Applied Materials, Inc., Santa Clara, Calif.

[21] Appl. No.: 32,041

[22] Filed: Mar. 16, 1993

[51] Int. Cl.$^5$ ............................................. F16K 39/02
[52] U.S. Cl. ...................................... 137/1; 137/487.5; 251/26; 251/158; 251/175; 251/335.3; 251/900; 414/217
[58] Field of Search .................... 137/1, 487.5; 251/26, 251/158, 175, 900, 335.3; 414/217

[56] References Cited

U.S. PATENT DOCUMENTS

| | | | |
|---|---|---|---|
| 3,977,423 | 8/1976 | Clayton | 137/487 X |
| 4,909,271 | 3/1990 | Canaan et al. | 251/335.3 X |
| 4,991,619 | 2/1991 | Della Porta | 251/335.3 X |
| 5,226,632 | 7/1993 | Tepman et al. | 251/335.3 |

*Primary Examiner*—Gerald A. Michalsky

*Attorney, Agent, or Firm*—Jacques M. Dulin; Harold T. Fujii; Claude A. S. Hamrick

[57] ABSTRACT

Low particulate slit valve system and method for controlling the closure pressure applied to a slit valve. An apparatus in accordance with the present invention includes a barrier having a slit valve aperture, a valve seat surrounding the aperture, a closure movable towards and away from the valve seat, a sensing mechanism for determining the pressure differential on the two sides of the barrier, a processing unit responsive to the pressure differential and operative to produce a control signal, and a valve actuator responsive to the control signal and operative to control the force applied to the closure. The method of the invention includes determining a first fluid pressure on a first side of the barrier, determining a second pressure on a second side of the barrier, and applying a closure pressure to the closure which is related to the pressure differential between the first fluid pressure and the second fluid pressure. If the pressure differential is low, zero or very near to zero pressure is applied to the closure to seal the aperture. If the pressure differential is high, a proportionately larger pressure is applied to the closure.

14 Claims, 10 Drawing Sheets

LOW PARTICULATE SLIT VALVE SYSTEM AND METHOD FOR CONTROLLING SAME

BACKGROUND OF THE INVENTION

1. Field of the Invention

The present invention relates generally to chamber closure apparatus used in semiconductor processing apparatus and more particularly to a slit valve closure and associated actuating and control system and method.

2. Brief Description of the Prior Art

Various types of semiconductor manufacturing equipment are used to process semiconductor wafers during the manufacturing of integrated circuits (IC's). For example, chemical vapor deposition (CVD) systems are used to deposit insulating and non-insulating layers over a wafer, plasma etch systems are used to etch a wafer or a layer formed over the wafer, and physical vapor deposition or "sputter" systems are used to physically deposits conductive layers over a wafer. These various processes are usually performed within sealed processing chambers so that the processing conditions can be tightly controlled.

A common way of putting a wafer into a processing chamber and then subsequently removing it is to provide a "slit valve" in a wall of the processing chamber. An elongated, usually horizontal, aperture is formed in the wall. The aperture is sufficiently wide and high to permit the passage of a semiconductor wafer supported by the blade of a robotic wafer handling arm, and is surrounded by a valve seat. An elongated valve closure selectably engages the seat to close the aperture or disengages from the seat to open the aperture.

When the slit valve is closed, a gas-tight seal is required in order to isolate the chamber from external influences. This usually requires an elastomeric gasket or seal, such as an O-ring seal, disposed between the valve seat and the closure. Since the pressure on one side of the slit valve can be as high as atmospheric pressure, while the pressure on the other side of the slit valve can be as low as $10^{-8}$ torr, one atmosphere or more of pressure is often applied to the closure to ensure that the slit valve does not leak even under the most adverse of conditions. This amount of pressure tightly compresses the O-ring seal between the closure door and the valve seat.

It is very important to minimize sources of contamination in semiconductor manufacturing equipment. Even very small particles on the order of 0.2 microns can damage an IC device being created on a semiconductor wafer. A problem encountered with prior art slit valves is that, under high pressures, the elastomeric material of the O-ring is compressed into the metal surfaces of the valve seat and closure such that, when the slit valve is opened, the O-ring is ripped from the metal surface of either the valve seat or the closure, thereby creating a large cloud of particles which can settle on a wafer, on surrounding surfaces, or remain suspended for a considerable period of time. Particles that eventually settle onto the active surface of the wafer can greatly reduce the yield of usable integrated circuits from that wafer.

The problem of particle cloud generation during slit valve opening is of even greater concern with the advent of multiple chamber semiconductor manufacturing equipment. Referring now to FIG. 1, wherein is illustrated a prior art multiple chamber semiconductor processing system 100. The system 100 includes a wafer handling chamber 102, a wafer cassette loading/unloading chamber 104, and a number of wafer processing chambers 106a–106d. The system 100 is typically designed to process a single wafer 108 at a time within any one of the processing chambers 106.

The wafer handling chamber 102 is provided with a computer controlled robotic wafer handler 110 which can support and move the wafer 108. A typical wafer handler 110 includes a "frog's leg" assembly 112 which is coupled at one end to a motor assembly 114 and, at the other end, to a wafer support blade 116. The motor assembly 114 allows the blade 116 to be rotated around an axis A of the motor assembly 114 and also to be moved radially in and out relative to the axis A as indicated by an arrow 118, by opening and closing the "frog's leg" assembly 112 in the direction of an arrow 120. These two degrees of movement allow the wafer handler 110 to move the wafer 108 into and out of the loading/unloading chamber 104 and the processing chambers 106a–106d.

Wafer handlers, such as the handler 110, are commercially available from such companies as Applied Materials of Santa Clara, Calif.

The wafer handling chamber 102 is pentagonal in shape to accommodate the four processing chambers 106a–106d and the loading/unloading chamber 104. A slit valve assembly is disposed in a wall of each of the chambers 104, 106a–106d. Thus, a slit valve assembly 130a is disposed in a chamber wall 132a that forms a boundary between the handling chamber 102 and the processing chamber 106a. Also, a plurality of slit valve assemblies 130b, 130c, 130d are disposed in chamber walls 132b, 132c, 132d, respectively, that form a boundary between the handling chamber 102 and the other processing chambers 106b, 106c, 106d, respectively. Similarly, a slit valve assembly 130e is disposed in a chamber wall 132e that forms a boundary between the handling chamber 102 and the loading/unloading chamber 104. The slit valve assemblies 130a–130e permit the wafer 108 to pass through the walls 132a–132e, respectively, of the handling chamber 102 into the chambers 106a, 106b, 106c, 106d and 104, respectively. Typically, the wafer handling chamber 102 is evacuated during the wafer handling process by a vacuum pump (not shown).

In operation, a stack of wafers (not shown) is placed within the loading/unloading chamber 104, and the slit valve assembly 130e is opened to permit the handler 110 to remove one or more of the wafers from the loading-/unloading chamber 104. The slit valve 130e is then closed and the handling chamber 102 is evacuated.

A slit valve assembly to one of the processing chambers 106a–106d is opened to permit the wafer 108 to be placed on a pedestal 134a–134d, respectively, disposed in the processing chamber. As an example of a multiple processing operation, the wafer 108 is initially provided with an oxide layer and is then etched. Thus, in the initial step, the wafer 108 is to be placed in, for example, chamber 106a which is an oxide CVD chamber. Slit valve 130a is opened and the handler 110 passes the wafer 108 through the opening and places it on the pedestal 134a. Slit valve 130a is then closed and the CVD process is performed. After the completion of the CVD process, the slit valve 130a is opened and the wafer 108 is removed by the handler 110 and the slit valve 130a is closed. In the next processing step, the wafer 108 is etched in a reactive ion etch (RIE) chamber. If chamber 106b is an RIE chamber, slit valve 130b is opened, the handler 110 places the wafer 108 on the pedestal 134b, and the slit valve 130b is closed. After the RIE process is performed, the slit valve 130b is reopened, the handler 110 removes the wafer 108, and the slit valve 130b is closed. After the wafer 108 has been completely processed and it is returned to the loading-/unloading chamber 104.

At every step in the process, a corresponding slit valve assembly is opened and closed. Since each slit valve opening creates particles which could potentially contaminate the wafer, it is particularly desirable to minimize the number of particles created with each opening of a slit valve.

In a processing sequence such as described above, the wafer 108 may be exposed at least six times to the particles produced by the opening of a slit valve. If the wafer 108 undergoes additional processing steps, it will be exposed to even more slit valve openings. As the trend towards increasingly complex, multi-chamber semiconductor manufacturing equipment continues, the problem with slit valve contamination will become increasingly troublesome. Furthermore, as the feature widths of integrated circuits decrease, integrated circuit wafers will become even more sensitive to damage from such contamination.

SUMMARY OF THE PRESENT INVENTION

Briefly, a preferred embodiment of the present invention provides an apparatus and a method for controlling the closure pressure applied to the closure of a slit valve. An apparatus in accordance with the present invention includes a barrier having a slit shaped aperture, a valve seat surrounding the aperture, a closure movable towards and away from the valve seat, a sensing mechanism for determining the pressure differential on the two sides of the barrier, a processing unit responsive to the pressure differential and operative to produce a control signal, and a valve actuator responsive to the control signal and operative to control the closure force applied to the closure.

The method includes determining a first fluid pressure on a first side of the barrier, determining a second pressure on a second side of the barrier, and applying a closure pressure to the closure which is related to the pressure differential between the first fluid pressure and the second fluid pressure. If the pressure differential is low, zero or very near to zero pressure is applied to the closure to seal the aperture. If the pressure differential is high, a larger pressure is applied to the closure.

The method can be operated in either a discrete mode or in a continuously variable mode. In the discrete mode, two or more discrete pressures are chosen and one pressure is used for low pressure differentials and the other pressure is used for high pressure differentials. In the continuously variable mode, a proper closure pressure ranging from zero to a pre-determined maximum is calculated from the actual pressure differential on the opposing sides of the barrier.

The present invention is advantageous in that sufficient pressure is applied to the closure to prevent the slit valve assembly from leaking without applying excessive pressure to the closure. This is a significant advantage because in most semiconductor process equipment operating at high vacuum, wafers are transferred only between chambers at similar low pressures. Thus, in many process steps, unnecessarily excessive closing pressure is applied to the slit valve assembly. Since the number of particles generated by opening a slit valve is related to the closure pressure of the slit valve, the present invention can substantially reduce the number of contaminating particles generated by reducing the number of instances of high closure pressure applied to the slit valve assembly. Reducing the amount of particle contamination produced by the slit valve assemblies of semiconductor manufacturing equipment increases the usable yield of integrated circuits.

These and other advantages of the present invention will no doubt become apparent to those skilled in the art after having read the following detailed description of the preferred embodiment illustrated in the several figures of the drawing.

IN THE DRAWING

DESCRIPTION OF THE PREFERRED EMBODIMENT

Figure 1:
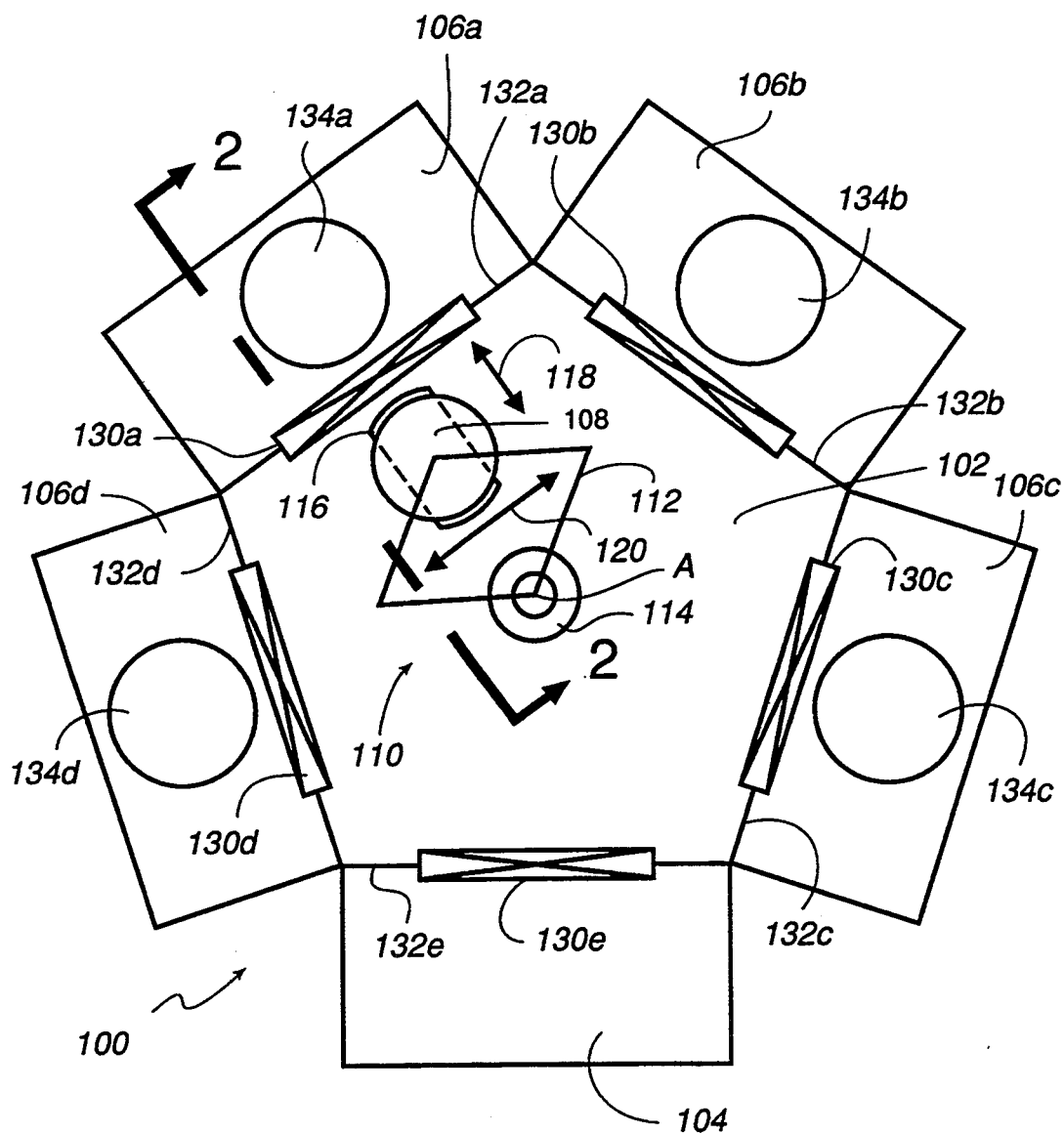
FIG. 1 is a plan view of a typical prior art multi-chamber semiconductor processing system which serves as an environment for the present invention.
Figure 2:
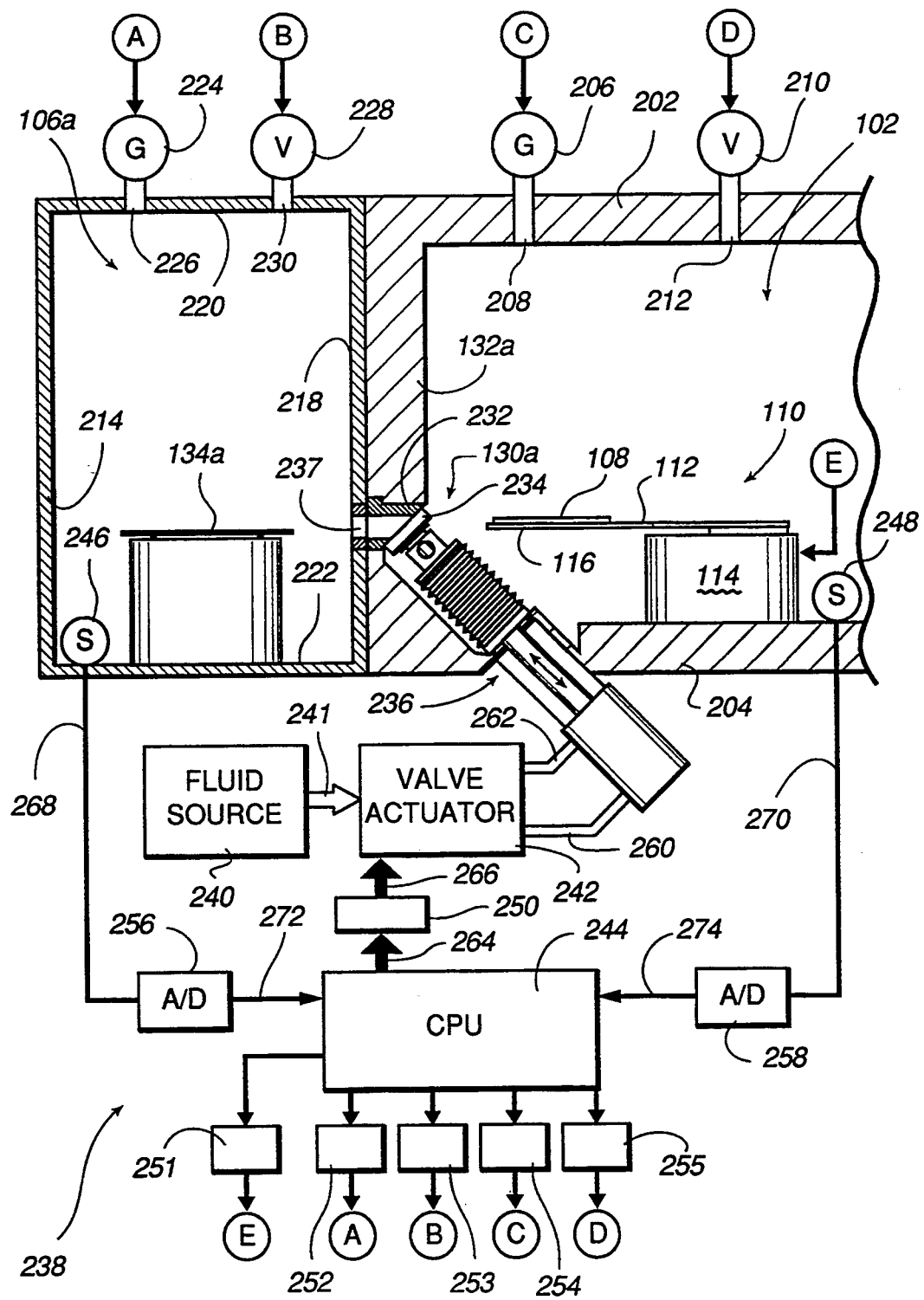
FIG. 2 is a cross-sectional view taken along line 2—2 of FIG. 1 illustrating a variable pressure slit valve apparatus in accordance with the present invention.

FIG. 2 is a partial sectional view of the semiconductor processing system 100 taken along line 2—2 of FIG. 1. The handling chamber 102 includes a top wall 202 and a bottom wall 204 in addition to the aforementioned pentagonally arranged side walls 132a through 132e. The motor assembly 114 of the handler 110 is supported by the bottom wall 204. Gasses, such as air, nitrogen, etc. can be released into the handling chamber 102 from a gas source 206, via a gas inlet port 208 in the top wall 202, and gasses can be evacuated from chamber 102 by means of a vacuum pump 210, via a similarly situated gas outlet port 212. It should be noted that for simplicity the second slit valve assembly 130b is not shown in the background of the figure.

The processing chamber 106a has side walls 214, 216, and 218, a top wall 220 and a bottom wall 222, and can be completely isolated from the ambient environment. Gases, such as process gases, can be released into the processing chamber 106a from a gas source 224, via a gas inlet port 226 in its top wall 220, and the chamber 106a can be evacuated by a vacuum pump 228, via a similarly situated gas outlet port 230.

The slit valve assembly 130a includes a valve seat 232, a closure or valve door 234, a linear actuator assembly 236, and a control system 238. A horizontally elongated wafer aperture 237 is provided through walls 218, 132A and the valve seat 232, and is adapted to allow passage therethrough of a wafer 108 held in a horizontal orientation. A suitable slit valve assembly is described in co-pending U.S. patent application Ser. No. 07/830,809, filed Feb. 3, 1992, now U.S. Pat. No. 5,275,303, and assigned to the assignee of the present invention, such patent application being hereby incorporated by reference. Assembly 130a will be described in greater detail subsequently with reference to FIGS. 3a and 3b.

The control system 238 includes a pressurized fluid source 240, valving network 242, a central processing unit (CPU) 244, a pair of pressure sensors 246 and 248 disposed in the processing and handling chambers 106a and 102 respectively, a number of digital output drivers 250–255, and a number of analog-to-digital (A/D) converters 256 and 258 digitizing signals from the pressure sensors 246 and 248. Each slit valve assembly will have a similar control system. The fluid source 240 is communicatively coupled, via a pipeline 241, to the valving network 242. The pressure within the processing chamber 106a is sensed by the sensor 246, which is communicatively coupled, via a single line 258, to the A/D converter 256. The converter 256 digitizes the analog input and outputs a digital signal via a digital signal line 272, to the CPU 244. Similarly, the pressure within the handling chamber 102 is sensed by the sensor 248 which is communicatively coupled to the A/D converter 258 by an analog signal line 270. The A/D converter 258 is communicatively coupled to the CPU 244 via a digital signal line 274. As will be discussed in greater detail subsequently, CPU 244 calculates the proper closing pressure for the linear actuator assembly 236, and sends an actuating signal to the valving network via a signal bus 264, the output driver 250 and a signal bus 266, to adjust the fluid pressures provided to valving network 242 through a pair of pressure lines 260 and 262.

The CPU 244 can also be used to control other system functions, such as the processing gas source 224 via the driver 252, the processing vacuum pump 228 via the driver 253, the handling gas source 206 via the driver 254, the handling vacuum pump 210 via the driver 255, and the motor assembly 114 of the wafer handler 110, via the driver 251. Alternatively, these system functions can be controlled by a separate CPU or by other suitable control systems.

Figure 3A:
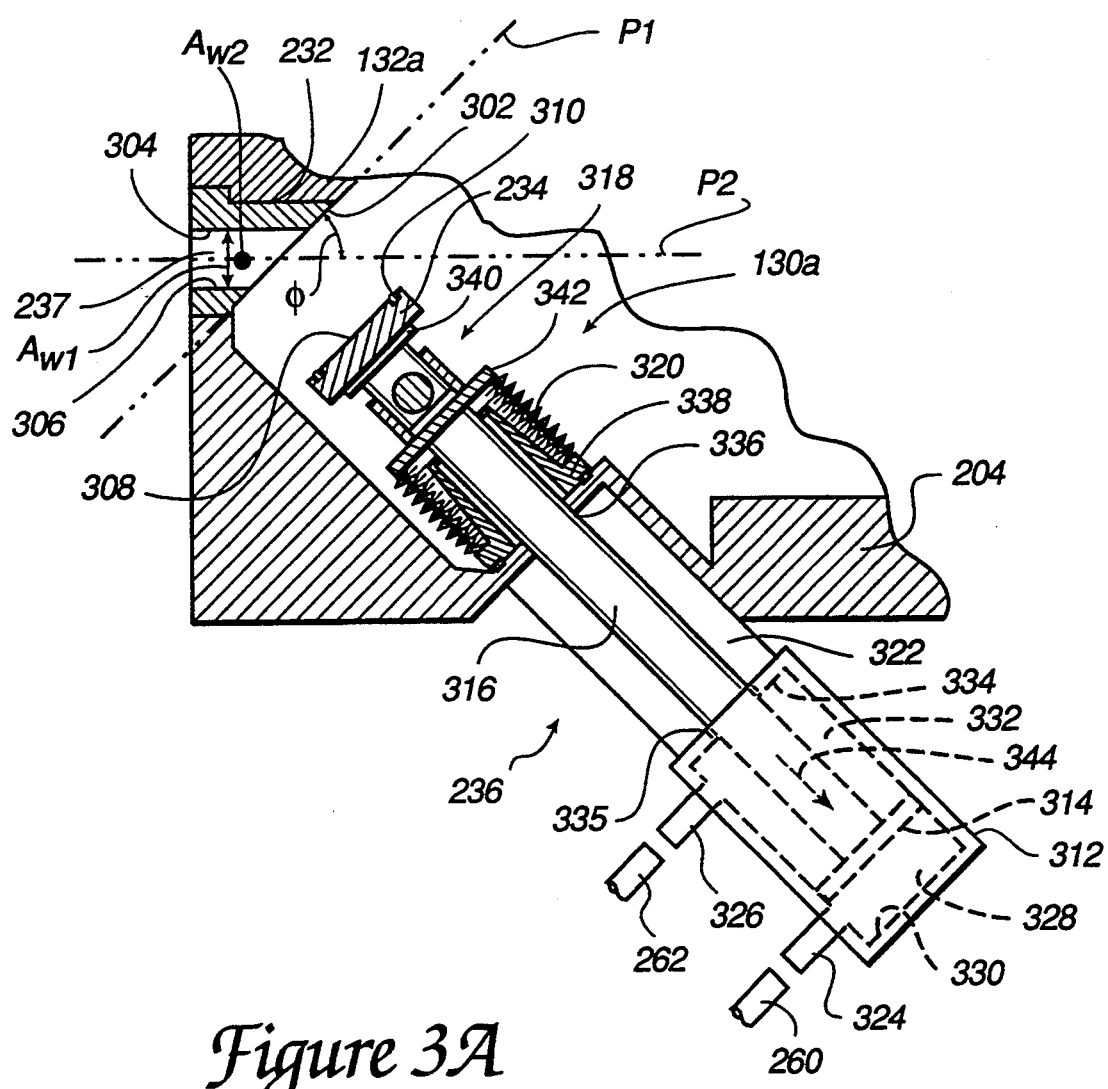
FIGS. 3a and 3b illustrate the slit valve of FIG. 2 in its open and closed position, respectively.

FIG. 3a illustrates the slit valve assembly 130a in greater detail. As mentioned previously, the slit valve assembly includes the valve seat 232, the closure 234, and the actuator assembly 236. The seat 232 extends through the wall 132a and forms the aperture 237. The seat 232 further includes a sealing face 302, an inner top wall 304, and an inner bottom wall 306. The sealing face 302 of the valve seat 232 lies in a sealing plane P1 which is angularly disposed relative to a wafer transfer plane P2. A typical included angle Φ, between planes P1 and P2, is 45 degrees. The aperture 237 has a minor, vertical axis $A_{W1}$ which is perpendicular to the wafer transfer plane P2, and a major, horizontal axis which is parallel to the wafer transfer plane P2, and which is shown extending into the plane of the paper of the figure. Aperture 237 should have a height sufficient to permit a wafer 108 and a wafer support blade 116 to extend through the aperture 237 without contacting the inner top wall 304 or the inner bottom wall 306 of the valve seat 232. The valve seat 232 is typically made from a process-compatible material such as aluminum.

Figure 3B:
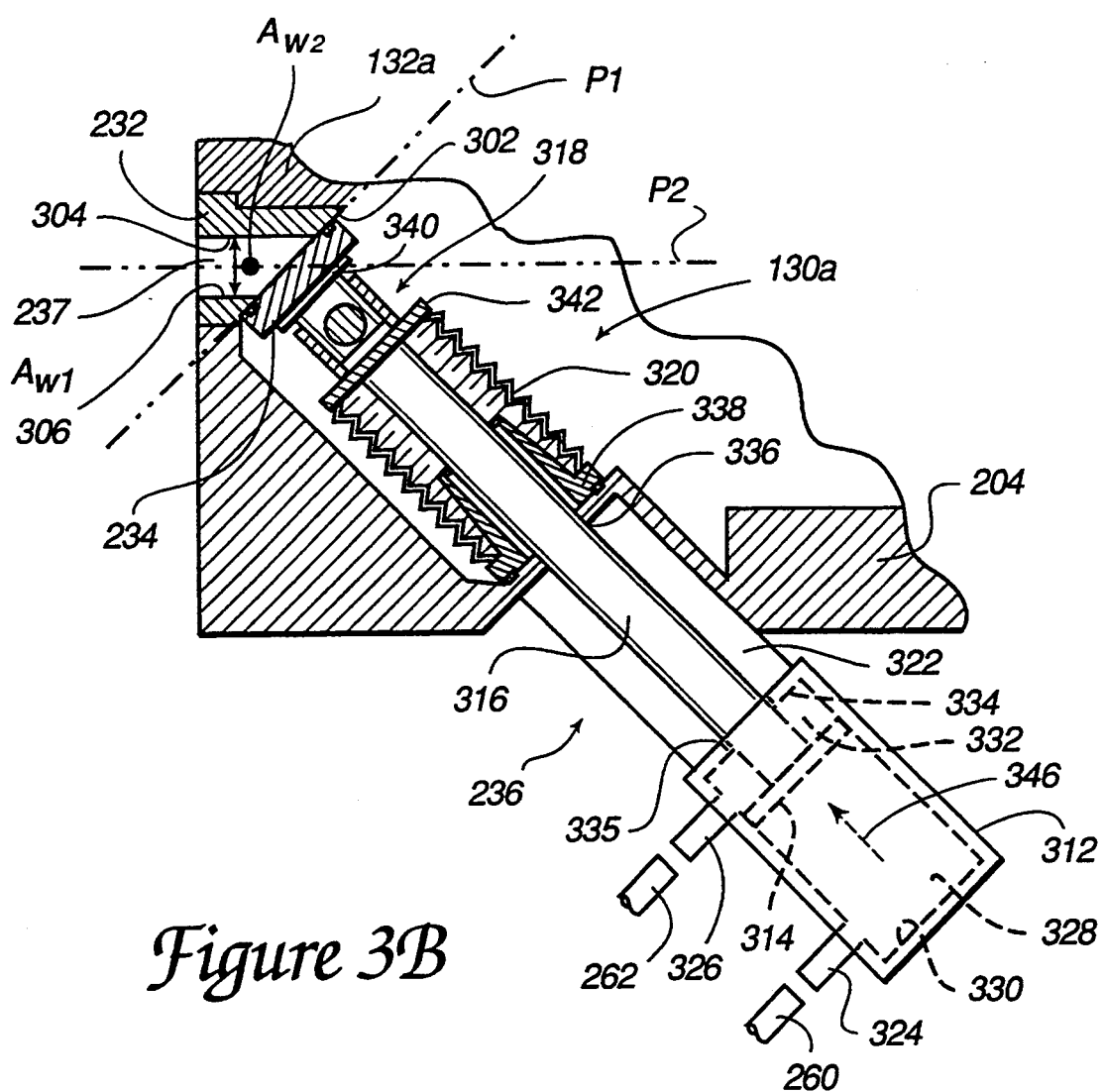

The closure 234 is an elongated, rectangular, planar structure adapted to engage the face 302 of the valve seat 232 in a sealing configuration; it includes, as illustrated in FIGS. 3a and 3b, a sealing face 308 having a circumscribing groove formed therein for carrying an O-ring seal 310. The sealing face 308 of the closure 234 is disposed parallel to the sealing plane P1 and thus to the sealing face 302 of the valve seat 232. The O-ring seal 310 is made from an elastomeric material such as CAL-REZ®, VITON®, TEFLON®-coated VITON®, or the like. The closure 234 is made from a process-compatible material such as aluminum.

The actuator assembly 236 includes a cylinder 312, a piston 314, a shaft 316, an adjustment mechanism 318, and a bellows 320. The cylinder 312 is attached to the bottom wall 204 of the handling chamber 102 by a bracket 322. The pressure lines 260 and 262 from the valve actuator 242 attach to the cylinder 312 at an inlet connections 324 and 326, respectively. Thus, the pressure line 260 is communicatively coupled, via the inlet connection 324, to a bottom cylinder chamber 328 formed between the piston 314 and an inner bottom wall 330 of the cylinder 312. Likewise, the pressure line 262 is communicatively coupled, via the inlet connection 326, to a top cylinder chamber 332 formed between the piston 314 and an inner top wall 334 of the cylinder 312.

The shaft 316 is attached at one end to the piston 314 and at the other end to the adjustment mechanism 318. The shaft 316, which is typically cylindrical, extends through an aperture 335 provided through the cylinder 312 and through a seal (not shown) surrounding this aperture 335. The shaft 316 also extends through an aperture 336 provided through the handling chamber bottom wall 204 and through a seal 338 which surrounds the aperture 336.

The adjustment mechanism 318 permits the orientation of the closure 234 to be adjusted to ensure that the sealing face 308 of the closure 234 is parallel to the sealing face 302 of the valve seat 232, and that the closure 234 fully closes the aperture 237 when the slit valve assembly 130a is closed. The adjustment mechanism 318 includes a top plate 340 attached to the back of the closure 234, and a bottom plate 342 attached to the upper end of the shaft 316. As will be appreciated by those skilled in the art, the remainder of the adjustment mechanism includes various pivots, slide adjustments, and setting mechanisms to provide the aforementioned adjustment capabilities. The bellows 320 extends between bottom plate 342 and the seal 338 to provide additional pressure sealing and to contain particles generated by the movement of the shaft 316 within the seal 338.

To open the slit valve assembly 130a, fluid pressure is applied to the above cylinder 312 via the pressure line 262 to move the piston 314 in a downwardly direction, as shown by an arrow 344, and to simultaneously move the closure 234 away from the valve seat 232. The closure 234 is preferably moved sufficiently far away from the valve seat 232 so that a wafer can be passed through the aperture 237 along the wafer transfer plane P2 without restriction.

Referring now to FIG. 3b, to close the slit valve, fluid pressure is applied to below the cylinder 312 via the pressure line 260 to move the piston 314 in an upwardly direction as shown by an arrow 346 until the closure 234 is moved into a sealing position against the valve seat 232. The fluid which activates the linear actuator 236 may be a hydraulic fluid, but is preferably a pneumatic fluid such as compressed air or nitrogen.

A more extensive discussion of the control of the fluids within the pressure lines 260 and 262 will be made subsequently.

Figure 4A:
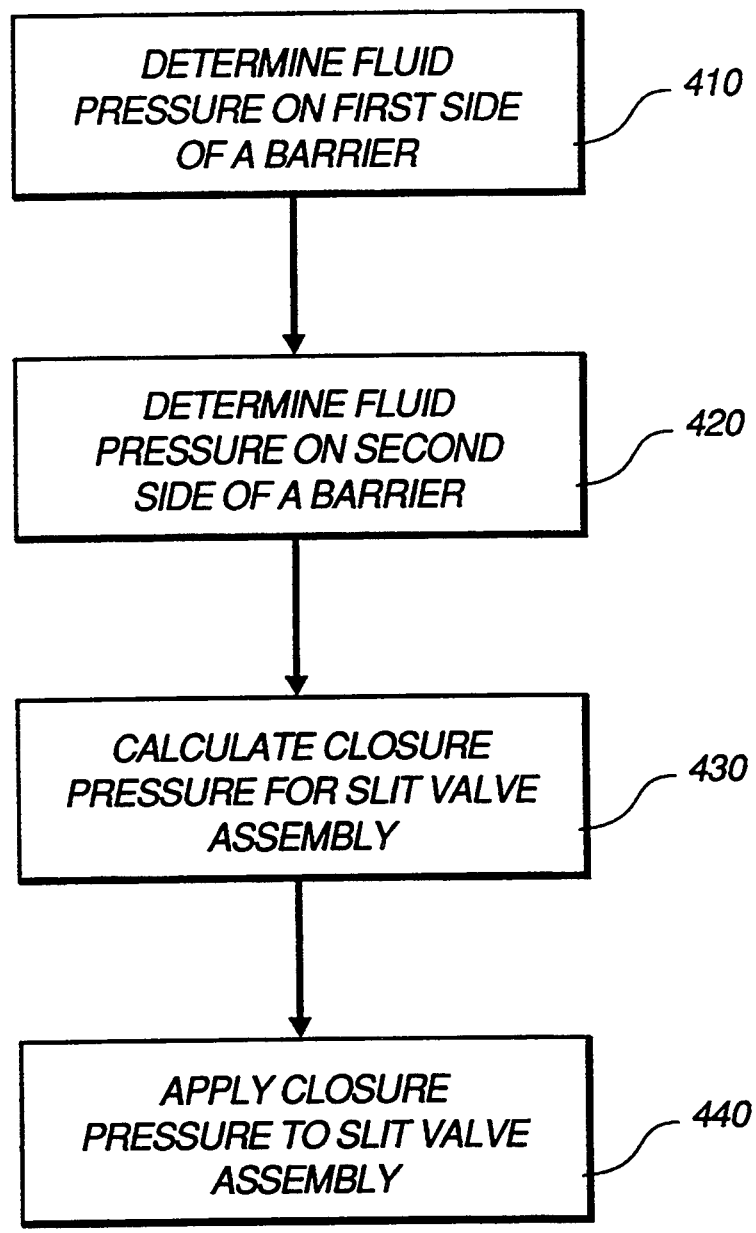
FIGS. 4a–4c are flow diagrams illustrating methods in accordance with the present invention.

FIG. 4a is a flow diagram depicting the principal steps of a first method for controlling the closure pressure applied to the closure in accordance with the present invention. This method can be used to advantageously control the control system 238 of FIG. 2. In a first step 410, the pressure within the handling chamber 102 (which is on a first side of a barrier wall 132a) is determined by pressure sensor 248. Next, in a step 420, the pressure within the processing chamber 106a (which is on a second side of barrier wall 132a) is determined by pressure sensor 246. Then, in a step 430, these two pressure readings are used by the CPU 244 to calculate a closure pressure for the slit valve assembly 130a. Finally, in a step 440, a closure pressure corresponding to the calculated closure pressure is applied to the slit valve assembly 130a by means of the valving network 242.

It should be noted that steps 410 and 420 of determining fluid pressure need not be accomplished by means of pressure sensors. For example, the fluid pressure within the chambers 102 and 106a might be known to the CPU due to its control over the inlet gas sources 206 and 224 and over the vacuum pumps 210 and 228. It is, however, preferable to utilize pressure sensors on both sides of the barrier wall to provide an actual measurement of the pressures rather than to estimate the pressures by some other means.

While the step of calculating a closure pressure in step 430 is preferably accomplished by a digital computer such as CPU 244, it can also be accomplished by other digital or analog control systems. As will be appreciated by those skilled in the art of electrical and electronic controllers, it is a relatively straightforward task to produce the proper control signals for the valving network 242 without using a digital computer.

Figure 4B:
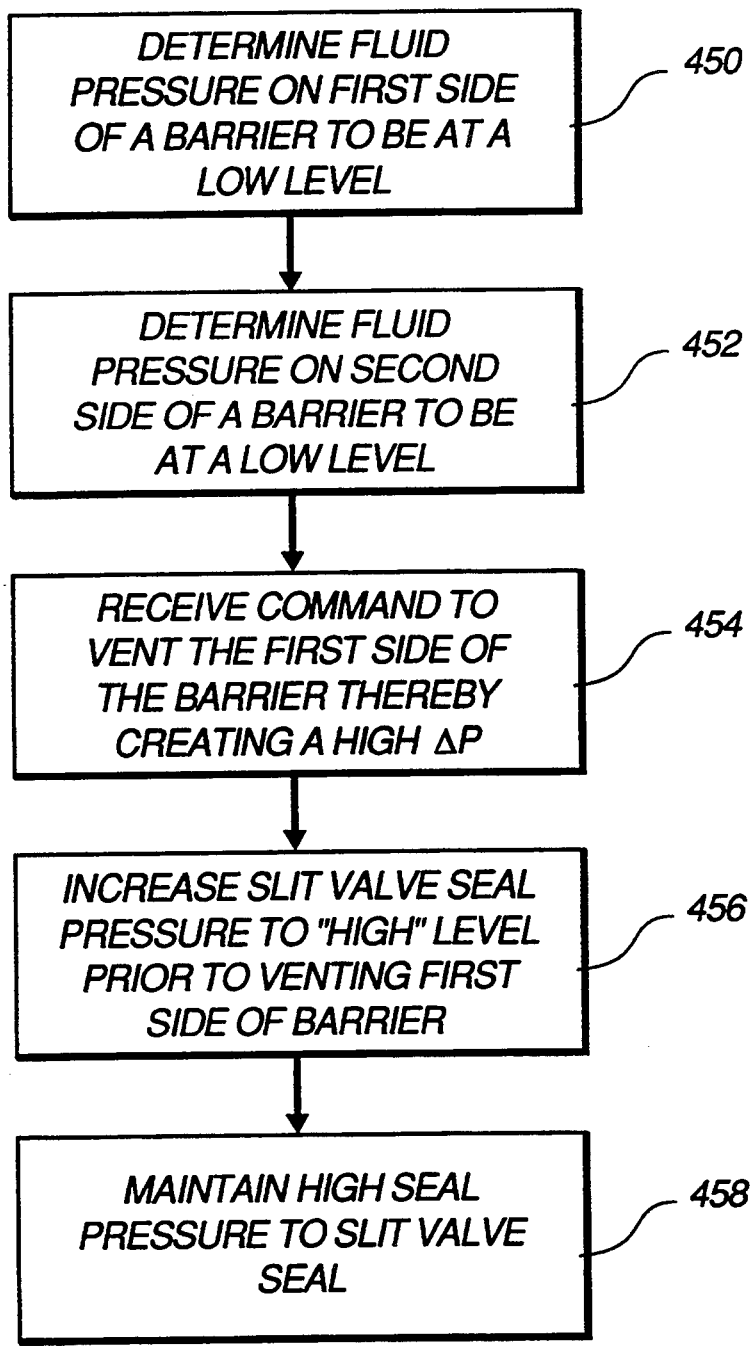

FIG. 4b is a flow diagram depicting a second method for controlling the closure pressure applied to the closure in accordance with the present invention. This method can be used to control the control system 238 (FIG. 2) where the pressure differential across the closure changes from a state of low differential pressure to a state of high differential pressure.

In a first step 450, the pressure within the handling chamber 102 (which is on a first side of a barrier wall 132a) is determined by pressure sensor 248 to be at a low level. Next, in a step 452, the pressure within the processing chamber 106a (which is on a second side of the barrier wall 132a) is determined by pressure sensor 246 to be at nearly the same low level. Thus, there is a low differential pressure across the barrier wall 132a.

In a step 454, the control CPU 244 receives a command to vent the processing chamber 106a to atmospheric pressure, for maintenance or other purposes thereby creating a high differential pressure across the barrier wall 132a. Then, prior to venting, in a step 456, the CPU 244 commands the valving network 242 to increase the slit valve pressure to a high level, thereby effectively sealing the aperture 237. Alternatively, the slit valve sealing pressure can be gradually increased in "real time" as the chamber is progressively vented (that is, as the differential pressure across the barrier wall 132a increases).

Finally, in a step 458, the CPU 244 maintains the slit valve pressure via feedback signals generated by the pressure sensors 246 and 248.

Figure 4C:
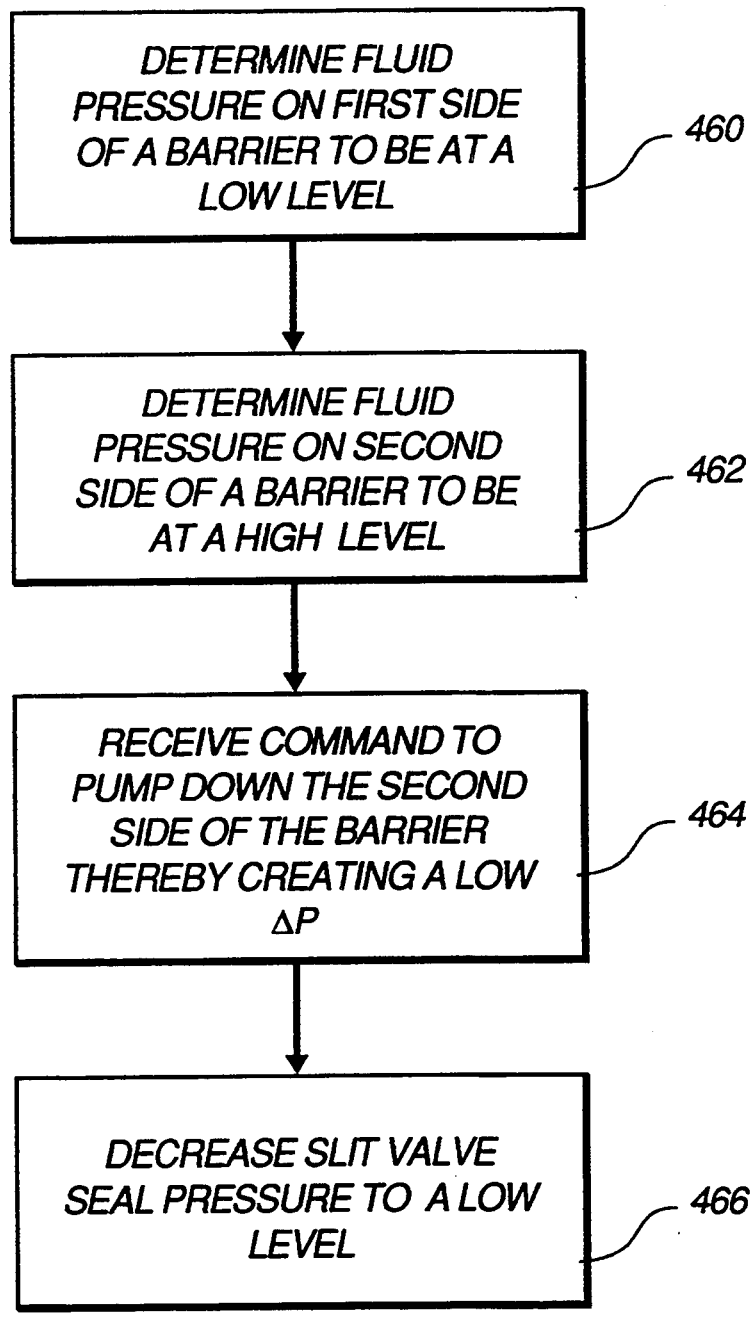

FIG. 4c is a flow diagram depicting a third method for controlling the closure pressure applied to the closure in accordance with the present invention. This method is employed to control the control system 238 when the pressure differential across the closure changes from a state of high differential pressure to a state of low differential pressure.

In a first step 460, the pressure within the handling chamber 102 (which is on a first side of the barrier wall 132a) is determined by pressure sensor 248 to be at a low level. Next, in a step 462, the pressure within the processing chamber 106a (which is on a second side of the barrier wall 132a) is determined by pressure sensor 246 to be at a much higher level. Thus, there is a high differential pressure across the barrier wall 132a.

In a step 464, the CPU 244 receives a command to pump down the processing chamber 106a, thereby creating a low differential pressure across the barrier wall 132a. After pumpdown, in a step 466, the CPU 244 commands the valving network 242 to decrease the slit valve pressure to a low level.

Figure 5A:
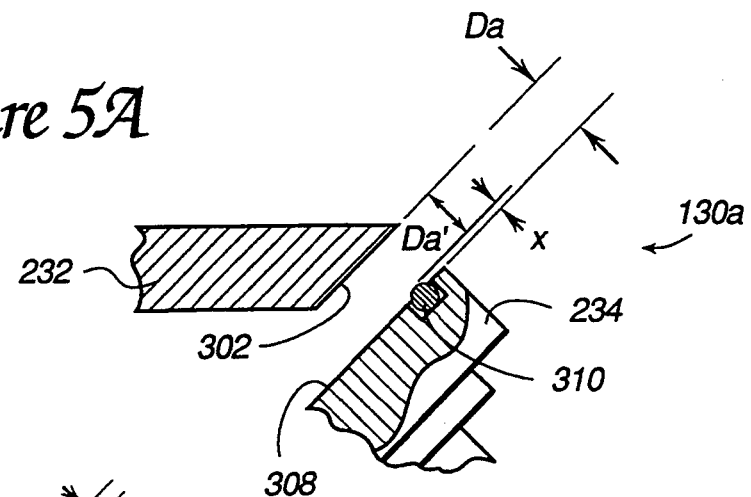
FIGS. 5a–5d illustrate various levels of closure of the slit valve of FIG. 2.

FIGS. 5a–5d illustrate four different positions of the closure 234 relative to the seat 232. In FIG. 5a, the slit valve is open such that the face 302 of valve seat 232 is separated from the face 308 of the closure 234 by a distance $D_a$. If the uncompressed O-ring 310 extends beyond the face 308 by a distance x, an actual distance $D_a'$ between the closure 234 and the face 302 is equal to $D_a' = D_a - x$.

Figure 5B:
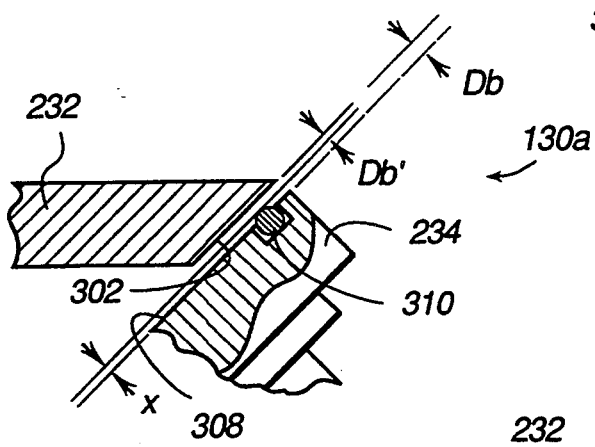

In FIG. 5b, the closure 234 has been positioned such that the faces 302 and 308 are separated by a small distance $D_b$, and where the closure 234 and the face 302 are separated by a very small actual distance $D_b'$ where $D_b' = D_b - x$. It is important to note that if this distance $D_b'$ is sufficiently small (e.g. less than 1.0 mm) and if the pressures on both sides of the barrier wall are very small (e.g. less than $10^{-4}$ torr) then the valve is effectively closed even though the O-ring 310 is not in contact with the face 302. This is because at these low pressures fluid conductance is so minimal that very little fluid will diffuse through the small gap of distance $D_b'$. Thus, a very low pressure may be applied to the cylinder 312 to maintain the closure in this position.

Figure 5C:
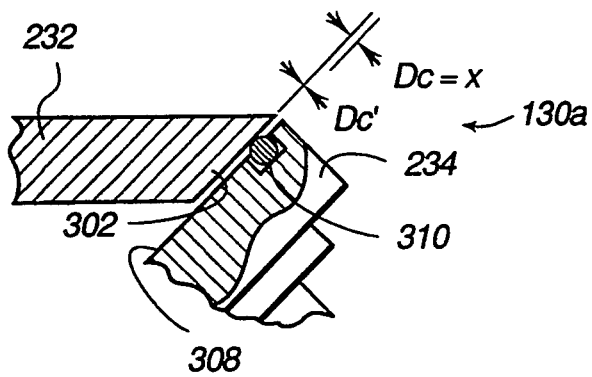

In FIG. 5c, the closure 234 has been moved such that a distance $D_c$ between the faces 302 and 308 is equal to x. In other words, the O-ring 310 is just touching the face 302 and an actual distance $D_c'$ between the O-ring 310 and the face 302 is equal to zero; i.e. $D_c' = D_c - x = 0$. A small pressure may be applied to the cylinder 312 to maintain the closure 234 in this position.

Figure 5D:
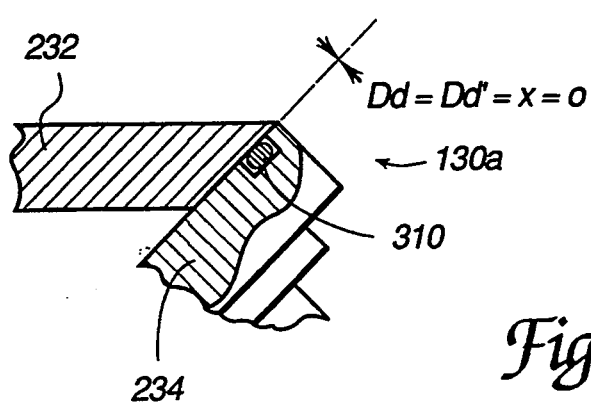

In FIG. 5d, the faces 302 and 308 are in direct abutment and the O-ring 310 is compressed such that x=0. Thus a distance between the face 302 and the face 308 is equal to an actual distance between the face 302 and the O-ring 310; i.e. $D_d = D_d' = 0$. To maintain the closure 234 in this position, a force at least equal to the resiliency of the compressed O-ring 310 must be applied to the closure 234.

Figure 6:
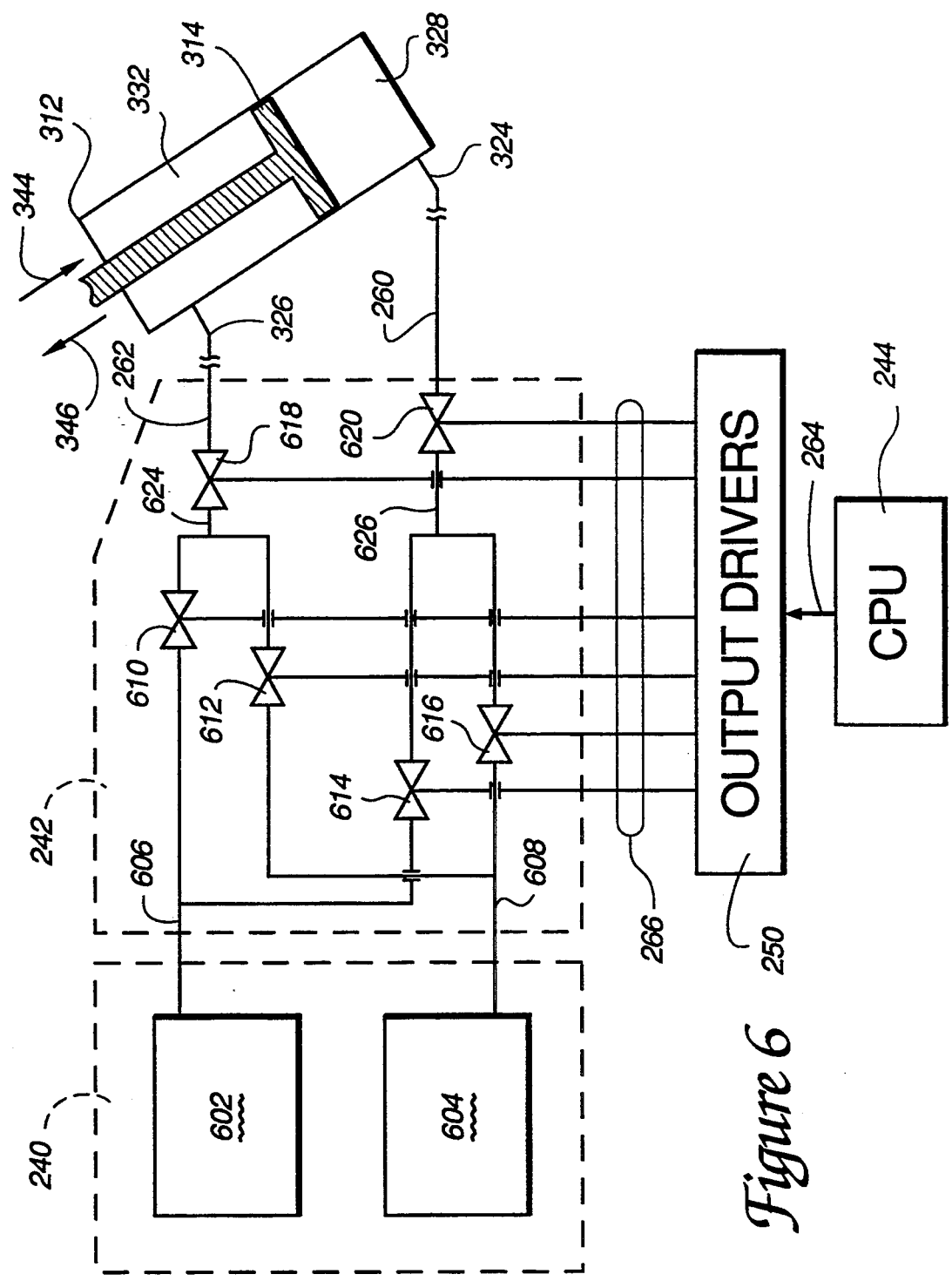
FIG. 6 is a block diagram of the preferred embodiment of the valve actuator and the fluid source of FIG. 2.

In FIG. 6, the fluid source 240 and the valving network 242 are schematically illustrated. The fluid source 240 includes a high pressure gas source 602 and a low pressure gas source 604. The high pressure source 602 is communicatively coupled, via a pipeline 606, to the valving network 242. Similarly, the low pressure source 604 is communicatively coupled, via a pipeline 608, to the valving network 242. Alternatively, single high pressure source can be used to provide both high pressure gas in the pipeline 606 and low pressure gas in the pipeline 608 by means of an appropriate pressure reducing valve (not shown). The gas supplied by the pressure sources 602 and 604 is preferably air, but it can also be another gas such as nitrogen. The high pressure gas from source 602 is preferably at about 60–100 psi, while the low pressure gas from source 604 is preferably at about 10 psi.

The valving network 242 includes six electrically activated valves 610, 612, 614, 616, 618, and 620. Suitable electric valves may be purchased from SMC of Garden Grove, Calif. as model number NVZ 3140-5MZ, 24 volt, solenoid activated valves. The valves 610-620 are selectively activated by the CPU 244, via the signal bus 266, the digital output drivers 250, and the signal, bus 264. The pipeline 606 communicatively couples the inputs of valves 610 and 6 14 to the high pressure source 602, and the pipeline 608 communicatively couples the inputs of valves 612 and 616 to the low pressure source 604. The outputs of the valves 610 and 612 are communicatively coupled to the input of valve 618 by a pipeline 624, and the outputs of the valves 614 and 616 are communicatively coupled to the input of the valve 620 by a pipeline 626. The outputs of the valves 618 and 620 are communicatively coupled to the pressure lines 262 and 260, respectively. As described earlier, the pressure lines 262 and 260 are respectively connected via the lines 326 and 324 to the chamber 332 (above the piston 314) and to the chamber 328 (below the piston 314) respectively.

The operation of the valving network 242 will be discussed in the context of the operation of the multiple chamber semiconductor processing system 100 (FIG. 1). The system 100 has essentially two practical modes of operation, a maintenance mode and a wafer transfer mode.

In the maintenance mode, a particular wafer processing chamber is vented to atmospheric pressure in order to conduct maintenance procedures on the chamber. However, the remaining processing chambers and the handling chamber 102, are not necessarily vented to atmosphere. These chambers may be kept at vacuum in order to continue with the wafer processing operations. Thus, while one processing chamber is at atmosphere, the handling chamber 102 may be at a vacuum causing a corresponding large differential pressure to exist across the slit valve assembly that forms the boundary between the chamber being maintained and the rest of the system 100. Consequently, the valves of the valving network 242 must be set so as to apply high pressure gas to the slit valve assembly in order to have the slit valve effectively withstand this large differential pressure.

As a specific example, referring additionally to FIG. 1 and 2, the processing chamber 106a is vented to atmosphere in order to perform maintenance operations therein. The remaining chambers are kept at a vacuum so as to not disrupt the ongoing processing operations. Thus, the slit valve assembly 130a is exposed to a high differential pressure; that is, atmospheric pressure on one side and vacuum (e.g., $10_4$ torr) on the other side. The CPU 244 can "sense" this pressure differential in one of two ways.

One way is for the CPU 244 to sense the pressure differential directly (i.e. through the pressure sensors 246 and 248). If the pressure differential, as sensed by the pressure sensors 246 and 248, increases beyond some threshold value, the CPU 244, through the signal bus 264, the driver 250, and the signal bus 266, commands the valves 620 and 614 to open and commands the valves 618, 610, 612, and 616 to close. When in this configuration, high pressure gas flows from the source 602, through the pipeline 606, through the valves 614 and 620, through the line 260, and through inlet connection 324 and into the chamber 328 below the piston 314.

The piston 314 moves in the direction of the arrow 346 and causes the closure 234 and the O-ring 310 to contact the seat 232 thereby sealing the aperture 237. The closure 234 is closed with high pressure gas to accommodate the high differential pressure across the slit valve assembly 130a. The other way for the CPU 244 to "sense" the pressure differential is to be commanded, through some higher level computer instruction that is input from some supervisory computer (not shown), to position the valves, in the manner described above, so as to permit high pressure gas to close the closure 234.

In the wafer transfer mode, the wafers are transferred from the handling chamber 102 into one of the processing chambers 106a through 106d. As a practical necessity, wafers are never transferred between chambers if the differential pressure between the chambers is not zero. If wafers are transferred when the differential pressure is high, then wafer movement would occur in the presence of large gas flows; the wafers would be severely damaged or contaminated. Thus, the wafers are moved through the aperture 237, i.e. the slit valve assembly is opened, only if the pressure differential across the slit valve assembly is zero or very low (i.e. $<10^{-3}$ torr).

As a specific example, if it is desired to transfer the wafer 108 from the handling chamber 102 into the processing chamber 106a, and the pressure in the handling chamber 102 is at some value $P_A$, and the pressure in the processing chamber 106a is at some value $P_B$, the slit valve assembly 130a will be opened if, and only if, the absolute value of the difference between $P_A$ and $P_B$ is a "low" value (i.e. $|P_A-P_B| \leq 10_{-3}$torr). Thus, in order to transfer wafers from one chamber to another chamber, $P_A$ and $P_B$ can both be at a "high" level, or both can be at a "low" level, but the absolute value of the difference between $P_A$ and $P_B$ can never be at a "high" value (i.e., greater than). As described earlier, the CPU 244 can "sense" this pressure differential directly (i.e. through the sensors 246 and 248) or can be instructed that this differential exists (i.e. through some higher level computer instruction that is input from some supervisory computer, not shown).

Referring now to FIG. 6, if the differential pressure across the slit valve is low and the values of $P_A$ and $P_B$ are both low, then the CPU 244, through the signal bus 264, the driver 250, and the signal bus 266, will command the valves 618 and 612 to open and command the valves 610, 614, 616, and 620 to close. When in this configuration, low pressure gas flows from the source 604 through the pipeline 608, through the valves 612 and 618, through the line 262, and through inlet connection 326 into the chamber 332 above the piston 314. The piston 314 moves downwardly in the direction of the arrow 344 and causes the closure 234 (FIG. 2) and the O-ring 310 (FIG. 3a) to break contact with the seat 232 thereby opening the aperture 237. On the other hand, if the differential pressure across the slit valve is low and the values of $P_A$ and $P_B$ are both high then the CPU 244 will position the valves so as to permit high pressure gas to open the slit valve aperture.

It should be noted that when the piston is moved so as to close the slit valve, the chamber 332 is vented in a manner known to one skilled in the art. Similarly, when the piston is moved so as to open the slit valve, the chamber 328 is vented in a manner known to one skilled in the art.

The wafer handler 110 (FIG. 2) carries the wafer 108 from the chamber 102, through the uncovered aperture 237, into the chamber 106a, and onto the pedestal 134a. The handler 110 is then retracted from the chamber 106a. The CPU 244, in the manner described above, commands the valves 620 and 616 (FIG. 6) to open, and commands the valves 610, 612, 618, and 614 to close. Low pressure gas flows from the source 604, in the manner described above, into the chamber 328 that is below the piston 314. The piston 314 then moves upwardly in the direction of the arrow 346 thereby causing the closure 234 and the O-ring 310 to make contact with the seat 232 and seal the slit valve. It will be appreciated that if the slit valve is exposed to a low differential pressure, but with $P_A$ and $P_B$ at high pressure levels, a similar sequence will be followed to close the slit valve closure.

Although a particular mode of operation has been disclosed as the preferred embodiment, an alternative embodiment wherein continuously variable pressure is applied to the closure will now be described.

Figure 7:
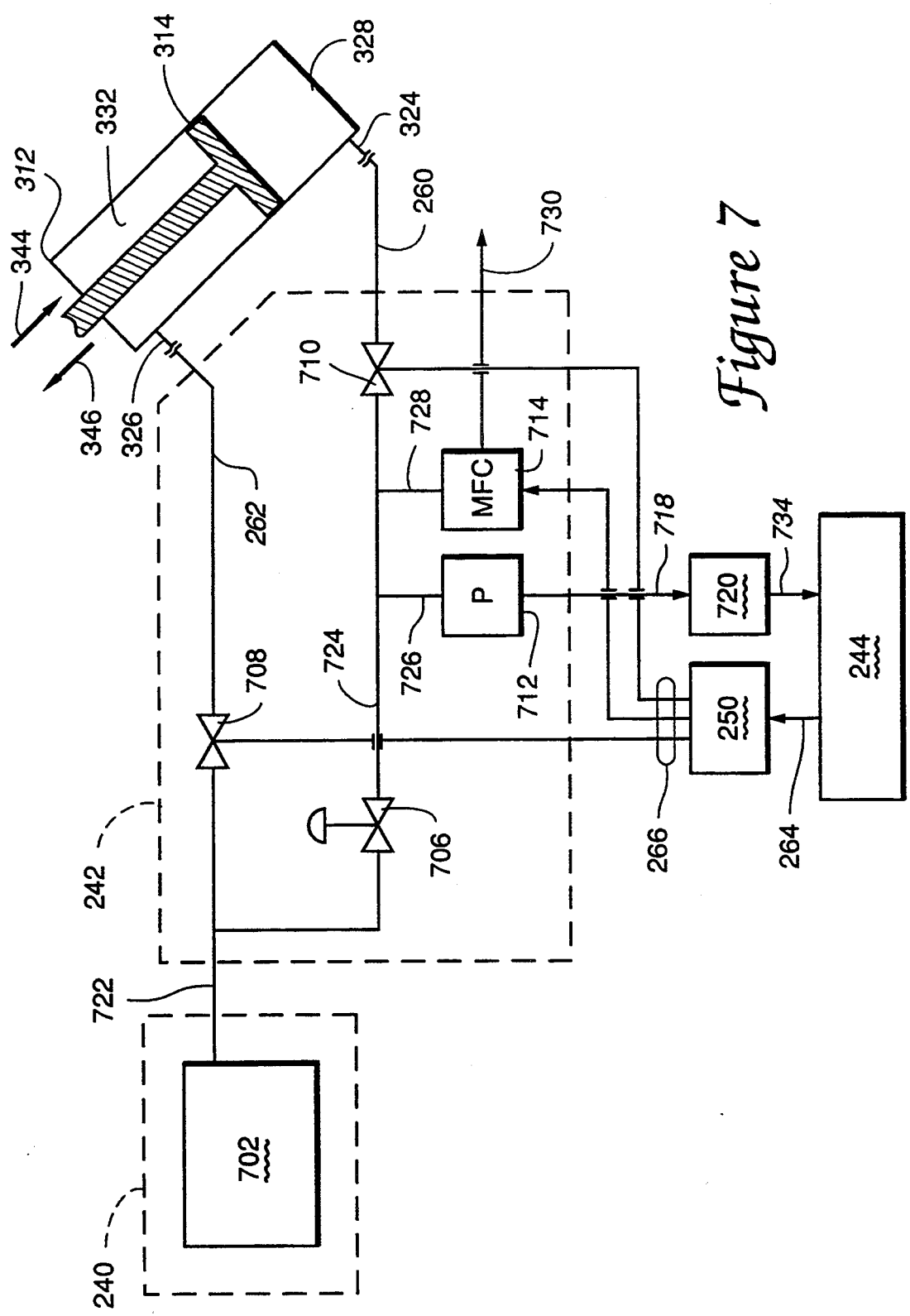
FIG. 7 is a block diagram of an alternate embodiment of the valve actuator and the fluid source of FIG. 2.

FIG. 7 illustrates a high pressure gas source 702 and a valving network 242 capable of controlling the slit valve assembly in a continuously variable mode. The high pressure gas source 702 is preferably a source of compressed air or compressed nitrogen at a pressure of about 100 psi. The valving network 242 includes a restrictor 706, two electrically activated valves 708 and 710, a pressure sensor 712, and a mass flow controller (MFC) 714. A suitable restrictor 706 is a manually operated micro metering valve available from NuPro Valve Company of Willoughby, Ohio. The electrically activated valves 708 and 710 can be the aforementioned valves from SMC. A suitable pressure sensor 712 can be purchased as model 107 BARATRON from MKS Instruments of Andover, Mass. A suitable mass flow controller (MFC) 714 can be purchased from MKS Instruments (Andover, Mass). The valves 708 and 710 and the MFC 714 are communicatively coupled, by the signal output bus 266, the digital output driver 250, and the signal bus 264, to the CPU 244. The pressure sensor 712 is communicatively coupled, via a signal line 718, an analog to digital (A/D) converter 720, and a signal line 734, to the CPU 244.

The gas source 702 provides gas pressure in a pipeline 722 which is communicatively coupled to the inputs of the restrictor 706 and the valve 708. The output of the valve 708 is coupled to the pipeline 262 and the output of the restrictor 706 is coupled to the input of the valve 710 by a pipeline 724, the output of the valve 710 being connected to the pipeline 260. The pressure sensor 712 is communicatively coupled to the pipeline 724 via a pipeline 726 to sense the pressure therein, and the input of the MFC 714 is similarly coupled to the pipeline 724 via a pipeline 728. The output of MFC 714 is coupled to a pipeline 730 and is vented to the ambient environment in an appropriate fashion.

In operation, the CPU 244 calculates the proper closure pressure for slit valve assembly 130a using the equation:

$$P_c = \frac{(\Delta P \times A_d) + F_s}{A_c}$$

Wherein $P_c$ is the pneumatic sealing pressure to be provided on line 260, $\Delta P$ is the difference in pressure between pressure $P_a$ in processing chamber 106a and $P_b$ in the handling chamber 102, $A_d$ is the area of the face 308 of the closure 234 within the perimeter of O-ring 310, $A_c$ is the cross-sectional area of the piston 314, and $F_s$ is the desired sealing force. $F_s$ can range continuously from zero, as in the case illustrated in FIG. 5b, to a maximum force as in the case illustrated in FIG. 5d. This maximum force is determined by the diameter and hardness of the O-ring, and can be found in the "Parker O-ring Handbook." It is typically on the order of 10 $lb_f$ per linear inch of O-ring circumference.

To close the slit valve assembly, the pneumatic sealing pressure $P_c$ is first calculated by the CPU 244 as described above. The valve 708 is closed, and the valve 710 is fully opened. The actual pressure on the line 260, as sensed by the pressure sensor 712, is fed back to the CPU 244, via the A/D-converter 720. The CPU 244 instructs the MFC 714 to vent pressure from the line 260 until the pressure on the line 260 equals $P_c$. The CPU 244 continues to monitor the pressure in the line 260 and to dynamically control the MFC 714 to maintain a constant pressure in the line 260. The slit valve assembly 130a can be opened by closing the valve 710 and by opening the valve 708.

Although a preferred and alternate embodiment of the present invention has been disclosed above, it will be appreciated that numerous alterations and modifications thereof will no doubt become apparent to those skilled in the art after having read the above disclosures. It is therefore intended that the following claims be interpreted as covering all such alterations and modifications as fall within the true spirit and scope of the invention.

What is claimed is:

1. A method for controlling a closure pressure applied to a closure covering an aperture in a barrier having different fluid pressure on opposite sides of the barrier, comprising:
   determining a first fluid pressure on a first side of said barrier;
   determining a second fluid pressure on a second side of said barrier; and
   applying a closure pressure to said closure which is related to the pressure differential between said first fluid pressure and said second fluid pressure.

2. A method as recited in claim 1 wherein said closure pressure is within a range which extends from about zero pressure to a predetermined maximum pressure.

3. A method as recited in claim 2 wherein said closure is provided with a resilient perimeter seal surrounding said aperture and wherein said closure pressure is selected sufficient to compress said seal to position said closure closely proximate to said barrier but not to be in contact with said barrier.

4. A method as recited in claim 2 wherein said closure pressure is selected sufficient to move said closure into sealing contact with said barrier.

5. A method as recited in claim 2 wherein said closure pressure includes at least two selectable discrete pressure levels such that a lower closure pressure is applied to said closure when said pressure differential is lower than a predetermined threshold value and such that a higher closure pressure is applied to said closure when said pressure differential is higher than said predetermined threshold value.

6. A method as recited in claim 2 wherein said closure pressure includes a plurality of discrete pressure levels which are directly related said pressure differential.

7. A method for controlling a closure pressure applied to a closure covering an aperture in a barrier, said closure having a face provided with an O-ring sealing member adapted to surround said aperture, said method comprising:

measuring a first fluid pressure on a first side of said barrier;

measuring a second fluid pressure on a second side of said barrier; and setting a separation between said closure face and a barrier seat portion surrounding said aperture which is related to the pressure differential between said first fluid pressure and said second fluid pressure.

8. A method as recited in claim 7 wherein said separation is within a range of separations extending from sealing contact with said O-ring sealing member to a separation where said O-ring sealing member is closely proximate said seat portion but not touching said seat portion.

9. A variable closure pressure slit valve system for use in semiconductor processing chamber comprising:

barrier means provided with an aperture;

seat means surrounding said aperture;

closure means movable toward and away from said seat means;

means for determining a first fluid pressure on a first side of said barrier means and for determining a second fluid pressure on a second side of said barrier means;

actuator means for selectively moving said closure means toward and away from said seat means; and control means responsive to said first fluid pressure and said second fluid pressure and operative to develop discrete actuator control signals for controlling said actuator means and causing it to apply a closure force to said closure means which is related in a predetermined manner to the pressure differential between said first fluid pressure and said second fluid pressure.

10. A variable closure pressure slit valve system as recited in claim 9 wherein said closure includes an O-ring sealing member adapted to contact said seat and provide a resilient seal therebetween.

11. A variable closure pressure slit valve system as recited in claim 9 wherein said means for determining said first fluid pressure and said second fluid pressure includes a first pressure sensor located on said first side of said barrier means and a second pressure sensor located on said second side of said barrier.

12. A variable closure pressure slit valve as recited in claim 9 wherein said means for determining said first fluid pressure and said second fluid pressure includes means for providing said first fluid pressure on said first side of said barrier and means for providing said second fluid pressure on said second side of said barrier.

13. A variable closure pressure slit valve as recited in claim 9 wherein said actuator moves said closure in discrete steps in response to said control signals.

14. A variable closure pressure slit valve system as recited in claim 9 wherein said actuator means includes a high pressure source;

a low pressure source;

a fluid actuator having a housing, at first port and a second port formed in said housing, and an actuating piston disposed within said housing and disposed between said first port and said second port, said actuating piston connected to said closure means; and a valving network having a plurality of valves and connecting conduit, said valving network responsive to said actuator control signals and operative to selectively couple each of said high pressure source and said low pressure source to each of said first port or said second port, whereby responsive to said actuator control signals either a high pressure force or a low pressure force is applied to said actuating piston thereby causing it to apply said closure force to said closure means, said closure force being related in a predetermined manner to the pressure differential between said first fluid pressure and said second fluid pressure.

* * * * *